(12) United States Patent
Guo

(10) Patent No.: US 10,978,488 B2
(45) Date of Patent: Apr. 13, 2021

(54) FILM LAYER STRUCTURE, DISPLAY SUBSTRATE, AND DISPLAY DEVICE

(71) Applicant: BOE TECHNOLOGY GROUP CO., LTD., Beijing (CN)

(72) Inventor: Xixi Guo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/420,823

(22) Filed: May 23, 2019

(65) Prior Publication Data

US 2020/0043950 A1 Feb. 6, 2020

(30) Foreign Application Priority Data

Aug. 6, 2018 (CN) .......... 201821261220.X

(51) Int. Cl.
*H01L 27/12* (2006.01)
*H01L 29/417* (2006.01)

(52) U.S. Cl.
CPC ........ *H01L 27/1218* (2013.01); *H01L 27/124* (2013.01); *H01L 29/41733* (2013.01)

(58) Field of Classification Search
None
See application file for complete search history.

(56) References Cited

U.S. PATENT DOCUMENTS

| 6,064,104 A | * | 5/2000 | Omid-Zohoor | ............................ H01L 21/76224 257/510 |
|---|---|---|---|---|
| 2016/0105950 A1 | * | 4/2016 | Drzaic | ................. H05K 1/0296 174/251 |
| 2016/0293334 A1 | * | 10/2016 | Ehara | ..................... H01G 4/018 |
| 2016/0351098 A1 | * | 12/2016 | Lin | ...................... G02F 1/1345 |
| 2017/0188463 A1 | * | 6/2017 | Kim | ...................... H05K 1/028 |
| 2017/0278920 A1 | * | 9/2017 | Park | .................... H01L 51/0097 |
| 2017/0309843 A1 | * | 10/2017 | Kim | ...................... B32B 3/266 |
| 2018/0165996 A1 | * | 6/2018 | Ochi | ........................ G09F 9/30 |

* cited by examiner

*Primary Examiner* — Moazzam Hossain
(74) *Attorney, Agent, or Firm* — Dilworth & Barrese, LLP.; Michael J. Musella, Esq.

(57) ABSTRACT

A film layer structure, a display substrate and a display device are provided. The film layer structure includes a film base, which has a curved side for adjusting stress distribution of the film layer structure.

15 Claims, 2 Drawing Sheets

FILM LAYER STRUCTURE, DISPLAY SUBSTRATE, AND DISPLAY DEVICE

CROSS-REFERENCE TO RELEVANT APPLICATION

This application is based on and claims the benefit of priority from Chinese patent application No. 201821261220.X, titled "a film layer structure, array substrate and display device", and filed on Aug. 6, 2018, the disclosure of which is incorporated herein in its entirety by reference as a part of this application.

TECHNICAL FIELD

Embodiments of the present invention relate to a film layer structure, an array substrate, and a display device.

BACKGROUND

A flexible display device is a kind of bendable display devices with low power consumption, and is often applied to mobile terminals such as wearable display devices.

SUMMARY

According to embodiments of the present disclosure, there are provided a film layer structure, a display substrate and a display device.

According to first aspect of the present disclosure, there is provided a film layer structure, which includes a film base with a curved side for adjusting stress distribution of the film layer structure.

According to second aspect of the present disclosure, there is provided a display substrate including the above-mentioned film layer structure.

According to third aspect of the present disclosure, there is provided a display device including the above-mentioned display substrate.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
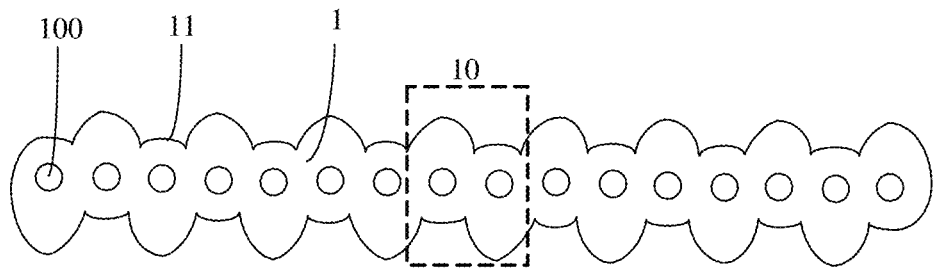
FIG. 1 is a top view illustrating a film layer structure provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Thickness of a flexible display device is far smaller than length and width of the flexible display device, so that the flexible display device is of a plane stress structure. Because the flexible display device is of a multi-layered film layer structure, a certain load is transferred among various film layer structures included in the flexible display device of the plane stress structure. In this way, some film layer structures with relatively small strength will be affected, causing the flexible display device to have problems. These influences are concretely represented as the following cases, warping, peeling, cracking, or other problems occurring to the film layer structures included in the flexible display device, and even film layer structures are delaminated from a base or peel off the base.

At present, a high-power microscope is generally used to observe the change of material of each film included in a flexible display device. However, this method cannot intuitively reflect stress distribution of film layer structure included in the display device.

In view of this, the inventor proposes to use a finite element emulation method to emulate a film layer structure included in an existing flexible display device. For example, the finite element emulation method is used to emulate a metal wire of an existing source-drain electrode layer. Upon emulation, one end of the metal wire is fixed, and a displacement load is applied to the other end of the metal wire. The emulation result shows that, the maximum tensile stress of the metal wire is approximately 321.5 MPA, and a phenomenon of stress concentration occurs at the fixed end of the metal wire. At this time, the fixed end of the metal wire is also the place where the break is prone to occur easily. The reason is that, displacement load applied to the end of the metal wire makes the metal wire deform; during the deformation of the metal wire, the stress is concentrated in the interior of the metal wire. And at the site of the metal wire with the greatest stress, strain of structure of the metal wire is also the largest. While the strain at the site of the metal wire with the greatest stress exceeds a tolerated strain or the stress exceeds a tolerated stress, the structure is destroyed, and in turns the entire screen is damaged.

As can be seen from the above, stress distribution of the metal wire of the above source-drain electrode is uneven. Because the metal wire of the source-drain electrode layer is thinner and has larger brittleness, the metal wire of the source-drain electrode layer is easy to break.

Figure 5:
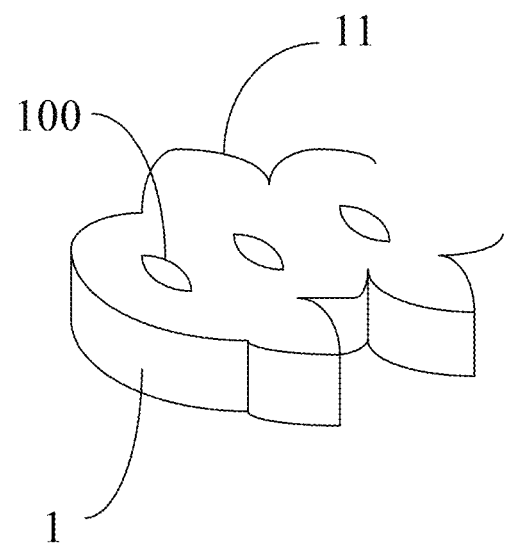
FIG. 5 is a locally stereoscopic diagram illustrating a film base provided by an embodiment of the present disclosure.

As illustrated in FIG. 1, according to an embodiment of the present disclosure, there is provided a film layer structure. The film layer structure may be a film layer structure with larger brittleness, for example, a metal film layer structure made of a common metallic material. For another example, the film layer structure may be a film layer structure made of an inorganic material whose elastic modulus is similar to that of the film layer structure of metallic material. The film layer structure includes a film base 1. The film base 1 has a curved side 11 configured for adjusting stress distribution of the film layer structure. The curved side 11 may be in an arc shape, and may also be wavy; any limitation to the shape of the curved side will not be made here. As illustrated in FIG. 5, the film base 1 provided by an embodiment of the present disclosure has a certain thickness, and may be used to fabricate electrically conductive film layer structures, such as electrically conductive wires, etc.

The inventor uses a finite element emulation method to simulate the above film layer structure. In the process of emulation, one end of the film layer structure is fixed, and load is applied to its other end. The simulation result shows that, when the edge of the film base 1 has a curved side 11, stress distribution of the film layer structure can be adjusted to make the stress distribution of the film layer structure homogenized. Therefore, when the edge of the film base 1 included in the film layer structure provided by an embodiment of the present disclosure has a curved side 11, the problem of stress concentration in the film layer structure can be effectively alleviated. As such, when the film layer structure is applied to a flexible object such as a flexible display device or the like, problems of cracking or even fracture of the film layer structure caused by bending of the flexible object are reduced.

Furthermore, in the case that the finite element emulation method is adopted for structure simulation of the film layer structure, not only numerical simulation can be done according to the design needs, so as to simulate various test schemes, reduce the test time and expenditure, and shorten the cycle of design and analysis; but also an optimal design can be used to reduce the consumption of material or cost loss. Besides, when the finite element emulation method is used for emulation of the film layer structure, a variety of test schemes can be simulated, and the test time and expenditure are reduced.

In addition, potential problems are found in advance before the fabrication of a flexible screen, problems that may occur during bending of the flexible screen are simulated according to different boundary conditions, and a deformation problem of flexible screen is alleviated or solved by different structural designs.

In some embodiments, as illustrated in FIG. 1, the film base 1 has a plurality of stress regulating holes 100 for regulating stress distribution of the film layer structure. For example, the stress regulating holes 100 may be holes with regular shape, such as circular holes, elliptical holes, square holes, or the like, and may also be holes with irregular shape. The aperture size of the plurality of stress regulating holes 100 may be the same or different from each other. When the film layer structure provided by the embodiment is deformed, drawn or bent, the plurality of stress regulating holes 100 provided by the film base 1 deform in the direction of the force generated by deformation, drag or bending under the action of a force. For example, in the case that the film layer structure is in a strip-shape and a plurality of stress regulating holes 100 of the film base 1 are all in circular shape, while the film layer structure is deformed, drawn or bent along the length direction, these circular stress regulating holes will be elongated along the length direction of the film layer structure, and turn into elliptical stress regulating holes from the original circular stress regulating holes. In the process that the circular stress regulating holes are changed into the elliptical stress regulating holes, it is also such a process that stress of the film layer structure is uniformly distributed in the film layer.

When the film layer structure provided by an embodiment of the present disclosure is stretched or bent to the same extent as an existing film layer structure, an internal stress generated by the film layer structure provided by the embodiment of the present disclosure is less than an internal stress generated by the existing film layer structure. Therefore, as compared with the prior art, the film layer structure provided by the embodiment of the present disclosure has better strength and flexibility, and is suitable for flexible objects, such as flexible display devices and so on.

In at least some embodiments, the plurality of stress regulating holes 100 may be distributed over the film base 1 in the following exemplary modes:

The first mode: the plurality of stress regulating holes 100 are evenly distributed over the film base 1. For example, as illustrated in FIG. 1, the plurality of stress regulating holes 100 are distributed on the film base 1 at equal interval.

The second mode: the plurality of stress regulating holes 100 are non-uniformly distributed on the film base 1.

Figure 4:
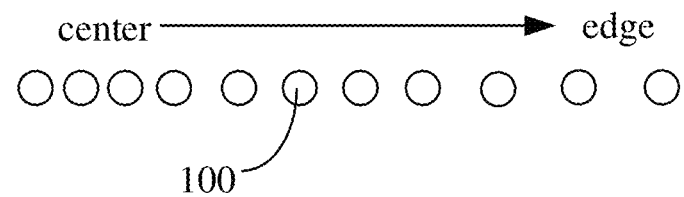
FIG. 4 is a schematic diagram illustrating a plurality of stress regulating holes of a film layer structure provided by an embodiment of the present disclosure.

The third mode: the density of stress regulating holes 100 provided by the film base 1 decreases gradually along the direction from the center of the film base to its edge. For example, this is illustrated in FIG. 4. In this case, it is advantageous to make distribution of stress at the middle region of the film base 1 uniform, as proven by a finite element emulation test.

The fourth mode: the spacing between two adjacent stress regulating holes 100 is larger than the diameter of at least one of the two adjacent stress regulating holes 100.

In the event that the finite element emulation method is used to simulate the film base 1 provided by the embodiment, it is found that the uniformity of stress distribution of the film layer structure can be effectively improved when the film base 1 has a plurality of stress regulating holes 100 for adjusting stress distribution of the film layer structure, and this renders the stress flexibility of the film layer structure better.

There are many ways to concretely implement the above film layer structure, and they will be described below in detail in conjunction with the attached drawings.

Figure 2:
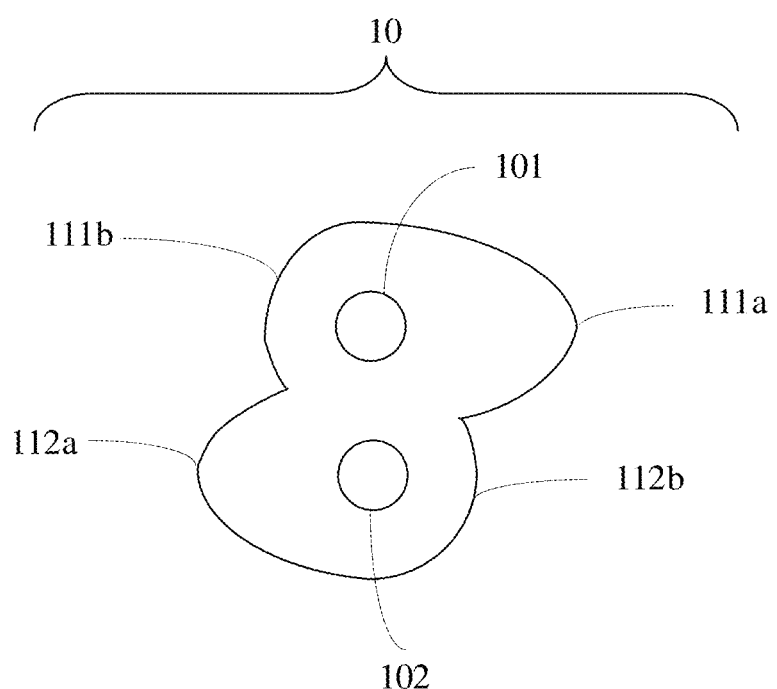
FIG. 2 is a schematic diagram illustrating a curved-side unit of a film layer structure provided by an embodiment of the present disclosure.

As illustrated in FIG. 1 and FIG. 2, the film base 1 includes at least one curved-side unit 10. A plurality of stress regulating holes 100 include at least one first stress regulating hole 101 and at least one second stress regulating hole 102. Each of the curved-side units 10 includes a first arc-side sub-unit 10*a* and a second arc-side sub-unit 10*b* connected to each other. Within the first arc-side sub-unit 10*a*, there is a first stress regulating hole 101 for adjusting stress distribution of the film layer structure, and within the second arc-side sub-unit 10*b*, there is a second stress regulating hole 102 for regulating stress distribution of the film layer structure.

As illustrated in FIG. 1 and FIG. 2, the first arc-side sub-unit 10a included by each of the curved-side units 10 has at least a first large-curvature arc side 111a and a first small-curvature arc side 111b (that is, curvature of the arc side 111a is greater than curvature of the arc side 111b). The second arc-side sub-unit 10b included by each of the curved-side units 10 has at least a second large-curvature arc side 112a and a second small-curvature arc side 112b. The first large-curvature arc side 111a included by the first arc-side sub-unit 10a is connected to the second small-curvature arc side 112b included by the second arc-side sub-unit 10b in each curved-side unit 10; and the first small-curvature arc side 111b included by the first arc-side sub-unit 10a is connected to the second large-curvature arc side 112a included by the second arc-side sub-unit 10b in each curved-side unit 10.

For example, the film base includes a plurality of curved-side units, and the arranging order of the first arc-side sub-unit 10a and the second arc-side sub-unit 10b is the same in each of curved-side units. As illustrated in FIG. 1 and FIG. 2, in two adjacent curved-side units 10, a first large-curvature arc side 111a included by a first arc-side sub-unit 10a in one of the curved-side units 10 is connected to a second small-curvature arc side 112b included by a second arc-side sub-unit 10b in the other one of the curved-side units 10. A first small-curvature arc side 111b included by the first arc-side sub-unit 10a in one of the curved-side units 10 is connected to a second large-curvature arc side 112a included by the second arc-side sub-unit 10b in the other one of the curved-side units 10. In this case, a curved-side 11 of the film layer structure formed by the above curved-side units 10 is illustrated in such an arranging manner that a small curvature arc side and a large curvature arc side are alternately arranged.

In some embodiments, as illustrated in FIG. 1 and FIG. 2, the first large-curvature arc side 111a and the second large-curvature arc side 112a in each of the curved-side units 10 have the same curvature; the curvature of the first small-curvature arc side 111b is the same as that of the second small-curvature arc side 112b in each of the curved-side units 10, and the arc radius of the first small-curvature arc side 111b is larger than the diameter of the first stress regulating hole 101.

Optionally, as illustrated in FIG. 1 and FIG. 2, ratio of the arc radius of the first large-curvature arc side 111a to the arc radius of the first small-curvature arc side 111b is (1.8-3.6):(4.5-6.5); ratio of the arc radius of the first small-curvature arc side 111b to the diameter of the first stress regulating hole 101 is (4.8-6.5):(2.5-4.5), and ratio of the shortest distance from the first large-curvature arc side 111a to the geometric center of the first stress regulating hole 101, to the diameter of the first stress regulating hole 101 is (10-12):(2.5-4.5).

Figure 3:
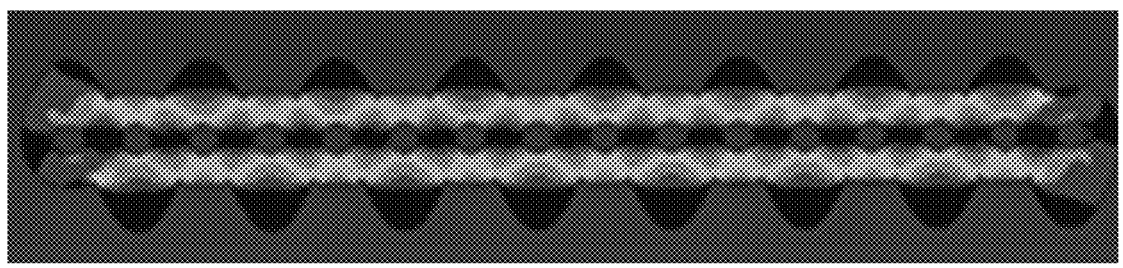
FIG. 3 is a diagram illustrating the finite element emulation of a film layer structure provided by an embodiment of the present disclosure.

The finite element emulation method is used to simulate the film layer structure. The simulation result shows that, the maximum tensile stress of the film layer structure is in the range of 300.1 MPa to 312.8 MPa, which is smaller than the maximum tensile stress of an existing metal wire. In addition, it can be seen from FIG. 3 that, stress of the film layer structure provided by an embodiment of the present disclosure is uniformly distributed throughout the film layer structure, especially in the middle of the film layer structure, the distribution is more even, and the stress is approximately distributed in the range of 45 MPa to 60 MPa.

Exemplarily, as illustrated in FIG. 1 and FIG. 2, ratio of the arc radius of the first large-curvature arc side 111a to the arc radius of the first small-curvature arc side 111b is approximately 3:6. Exemplarily, ratio of the arc radius of the first small-curvature arc side 111b to the diameter of the first stress regulating hole 101 is approximately 6:4. Exemplarily, ratio of the shortest distance from the first large-curvature arc side 111a to the geometric center of the first stress regulating hole 101, to the diameter of the first stress regulating hole 101 is approximately 11.5:4. Exemplarily, the diameter of the first stress regulating hole 101 and diameter of the second stress regulating hole 102 are same as each other. In this case, the maximum tensile stress of the film layer structure is approximately 306.7 MPa, which is smaller than the maximum tensile stress of an existing film layer structure of metal wire. In addition, it can be seen from FIG. 3 that, stress of the film layer structure provided by an embodiment of the present disclosure is uniformly distributed throughout the film layer structure, especially in the middle of the film layer structure, distribution is more even, and the stress is approximately distributed at about 50 MPa or so.

According to an embodiment of the present disclosure, there is further provided a display substrate, including at least one of the above film layer structures.

As compared with the prior art, beneficial effects of the display substrate provided by the embodiment of the present disclosure are the same as those of the film layer structure provided by the above embodiment, and details are omitted here.

Figure 6:
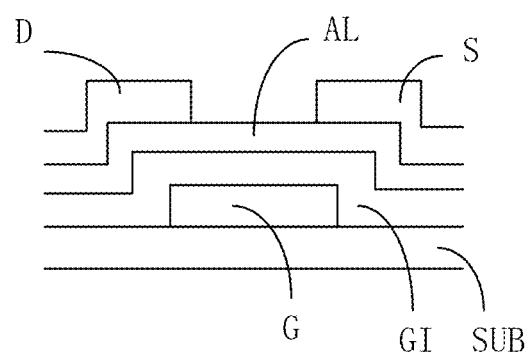
FIG. 6 is a schematic diagram illustrating a display substrate provided by an embodiment of the present disclosure.

For example, the display substrate is an array substrate, and one of the at least one film layer structure is a source-drain electrode layer. For example, as illustrated in FIG. 6, the array substrate includes a base substrate SUB. A gate electrode G, a source electrode S and a drain electrode D are formed on the base substrate. A gate insulating layer GI and an active layer AL are formed over the gate electrode G.

The film layer structure may also be a film layer structure made of a metallic material for a gate electrode, scan lines, signal lines or the like, or a film layer structure made of an inorganic material whose elastic modulus is similar to that of the metallic material.

According to an embodiment of the present disclosure, there is further provided a display device, including the above display substrate.

As compared with the prior art, beneficial effects of the display device provided by the embodiment of the present disclosure are the same as those of the array substrate provided by the above embodiment, and details are omitted here.

The display device provided by the above embodiment may be any product or component with a display function such as a mobile phone, tablet computer, TV set, display, notebook computer, digital photo frame, or navigator, etc.

In the disclosure, the following should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and a size of a layer or area may be enlarged or narrowed, that is, the drawings are not drawn in a real scale.

(3) In case of no conflict, features in one embodiment or in different embodiments can be combined as a new embodiment.

What is described above is related to the illustrative embodiments of the disclosure only and not limitative to the scope of the disclosure; the scopes of the disclosure are defined by the accompanying claims.

What is claimed is:

1. A film layer structure, comprising
a film base, having a curved side configured for adjusting stress distribution of the film layer structure, the film base comprising a plurality of curved-side units, each of the plurality of the curved-side units comprises:
a first curvature arc side and a second curvature arc side, wherein a curvature of the second curvature arc side is greater than that of the first curvature arc side, and the first curvature arc side and the second curvature arc side are alternately arranged and connected with each other to form the curved side of the film layer structure.

2. The film layer structure according to claim 1, wherein the film base further comprises a plurality of stress regulating holes configured for regulating stress distribution of the film layer structure.

3. The film layer structure according to claim 2, wherein the plurality of stress regulating holes are distributed on the film base at equal interval.

4. The film layer structure according to claim 2, wherein a density of the plurality of stress regulating holes decreases gradually along a direction from a center of the film base to an edge of the film base.

5. The film layer structure according to claim 2, wherein a spacing between two adjacent stress regulating holes in the plurality of the stress regulating holes is greater than a diameter of at least one stress regulating hole in the two adjacent the stress regulating holes.

6. The film layer structure according to claim 1, wherein a plurality of stress regulating holes comprise a first stress regulating hole and a second stress regulating hole; each of the plurality of the curved-side units comprises a first arc-side sub-unit with the first stress regulating hole provided therein and a second arc-side sub-unit with the second stress regulating hole provided therein, the first arc-side sub-unit and the second arc-side sub-unit are connected to each other.

7. The film layer structure according to claim 6, wherein the first arc-side sub-unit at least has a first arc side and a second arc side, and the second arc-side sub-unit at least has a third arc side and a fourth arc side; the first arc side of the first arc-side sub-unit and the fourth arc side of the second arc-side sub-unit are connected to each other, the second arc side of the first arc-side sub-unit and the third arc side of the second arc-side sub-unit are connected to each other.

8. The film layer structure according to claim 7, wherein a curvature of the first arc side is same as that of the third arc side, a curvature of the second arc side is the same as that of the fourth arc side, and the curvature of the first arc side is greater than that of the second arc side.

9. The film layer structure according to claim 7, wherein an arc radius of the second arc side is greater than a diameter of the first stress regulating hole.

10. The film layer structure according to claim 9, wherein a ratio of an arc radius of the first arc side to an arc radius of the second arc side is (1.8-3.6):(4.5-6.5), a ratio of the arc radius of the second arc side to the diameter of the first stress regulating hole is (4.8-6.5):(2.5-4.5), and a ratio of a shortest distance from the first arc side to a geometric center of the first stress regulating hole, to the diameter of the first stress regulating hole is (10-12):(2.5-4.5).

11. The film layer structure according to claim 10, wherein an arranging order of the first arc-side sub-unit and the second arc-side sub-unit is same in the plurality of curved-side units.

12. The film layer structure according to claim 10, wherein the film base comprises a wiring made of an electrically conductive material.

13. A display substrate, comprising the film layer structure according to claim 1.

14. The display substrate according to claim 13, wherein the film layer structure comprises a source electrode and a drain electrode.

15. A display device, comprising the display substrate according to claim 13.

* * * * *